United States Patent
Wang et al.

(10) Patent No.: US 8,286,672 B2
(45) Date of Patent: *Oct. 16, 2012

(54) GAS FILLING APPARATUS

(75) Inventors: Sheng-Hung Wang, Shulin (TW); Ming-Long Chiu, Shulin (TW)

(73) Assignee: Gudeng Precision Industrial Co., Ltd., Shulin (TW)

(*) Notice: Subject to any disclaimer, the term of this patent is extended or adjusted under 35 U.S.C. 154(b) by 1083 days.

This patent is subject to a terminal disclaimer.

(21) Appl. No.: 12/131,969

(22) Filed: Jun. 3, 2008

(65) Prior Publication Data

US 2009/0165888 A1 Jul. 2, 2009

(30) Foreign Application Priority Data

Dec. 27, 2007 (TW) .............................. 96150569 A

(51) Int. Cl.
*B65B 31/00* (2006.01)
(52) U.S. Cl. .............................. 141/39; 141/383; 141/98
(58) Field of Classification Search .................. 141/383, 141/39, 346, 348, 85, 98, 65; 414/935
See application file for complete search history.

(56) References Cited

U.S. PATENT DOCUMENTS

| | | | |
|---|---|---|---|
| 4,609,103 A | 9/1986 | Bimer et al. | |
| 4,664,479 A | 5/1987 | Hiroshi | |
| 4,724,874 A | 2/1988 | Parikh et al. | |
| 4,995,430 A | 2/1991 | Bonora et al. | |
| 5,320,218 A * | 6/1994 | Yamashita et al. | 206/213.1 |
| 5,433,574 A * | 7/1995 | Kawano et al. | 414/217 |
| 5,482,161 A * | 1/1996 | Williams et al. | 206/711 |
| 5,611,452 A * | 3/1997 | Bonora et al. | 220/378 |
| 5,810,062 A | 9/1998 | Bonora et al. | |
| 5,873,468 A | 2/1999 | Ejima et al. | |
| 5,879,458 A | 3/1999 | Roberson, Jr. et al. | |
| 5,988,233 A | 11/1999 | Fosnight et al. | |
| 6,032,802 A | 3/2000 | Ejima et al. | |
| 6,042,651 A | 3/2000 | Roberson, Jr. et al. | |
| 6,056,026 A | 5/2000 | Fosnight et al. | |
| 6,105,781 A | 8/2000 | Ejima et al. | |
| 6,164,664 A | 12/2000 | Fosnight et al. | |
| 6,187,182 B1 | 2/2001 | Reynolds et al. | |
| 6,221,163 B1 | 4/2001 | Roberson, Jr. et al. | |
| 6,319,297 B1 | 11/2001 | Fosnight | |
| 6,368,411 B2 | 4/2002 | Roberson, Jr. et al. | |
| RE39,241 E | 8/2006 | Fosnight | |
| 7,416,998 B2 * | 8/2008 | Kisakibaru et al. | 438/800 |
| 7,694,498 B2 * | 4/2010 | Pan et al. | 53/510 |
| 2005/0002763 A1 * | 1/2005 | Kampf et al. | 414/403 |
| 2009/0194197 A1 * | 8/2009 | Pan et al. | 141/346 |

* cited by examiner

*Primary Examiner* — Dinh Q Nguyen
*Assistant Examiner* — Jennifer Gordon
(74) *Attorney, Agent, or Firm* — Rosenberg, Klein & Lee

(57) ABSTRACT

This invention is about a gas filling apparatus for filling a gas into a storage apparatus for storing a semiconductor element or a reticle. The gas filling apparatus comprises a base and a port. The storage apparatus is loaded on the base. The port comprises a receiving part, which is connected with an air entrance of the storage apparatus. The contact portions of both the top of the receiving part and the air entrance of the storage apparatus are cambered surfaces and these two portions contacts in a ring fashion which is formed by the cambered surfaces mated with each other. The port also comprises a hole for the gas to pass through, and a joint port to connect with the air source.

16 Claims, 6 Drawing Sheets

GAS FILLING APPARATUS

BACKGROUND OF THE INVENTION

1. Technical Field

The present invention relates to gas filling apparatuses and, more particularly, to a gas filling apparatus for filling a gas into a storage apparatus for storing a semiconductor element or a reticle.

2. Description of Related Art

In the rapidly developing semiconductor technology, optical lithography plays an important role and wherever pattern definition is conducted, optical lithography is requisite. As to the application of optical lithography relating to semiconductors, a designed circuit pattern is used to produce a light-transparent reticle with a particular shape. Basing on the principle of exposure, after a light passes through the reticle to project on a silicon wafer, the circuit pattern formed on the reticle can be exposed onto the silicon wafer. Since any dust (such as particles, powders or an organic matter) can adversely affect the quality of such projected pattern, the reticle used to produce the pattern is required with absolute cleanness. Also, the silicon wafers and semiconductor elements also need to be absolutely clean. Thus, clean rooms are typically employed in general wafer processes for preventing particles in the air from defiling reticles and wafers. However, absolute dustless environment is inaccessible even in the known clean rooms.

Hence, storage apparatuses that facilitate protecting reticles and semiconductor elements from defilement are implemented in current semiconductor processes for the purpose of storage and transportation of reticles and semiconductor elements so as to ensure cleanness of the reticles and the semiconductor elements. When such storage apparatuses accommodate reticles and semiconductor elements in semiconductor processes, the reticles and the semiconductor elements can be isolated from the atmosphere when being transferred and conveyed between stations, so as to be secured from defilement caused by impurities that induces deterioration. Further, in advanced semiconductor factories, the cleanliness of the storage apparatuses is required to meet the Standard Mechanical Interface (SMIF), namely superior to Class 1. One solution for achieving the required cleanliness is to fill gas into the storage apparatuses. In the known technology, an external gas filling apparatus is connected with the storage apparatus so as to allow a gas to be filled into the storage apparatus through the gas filling apparatus.

The conventional gas filling apparatuses of all gas-filling types or means require an airtight device, which is typically an "o-ring seal", equipped at a port where the gas is filled into the storage apparatus, as shown in U.S. Pat. Nos. 5,879,458, 6,042,651, 6,221,163, and 6,368,411, for preventing the gas from overflowing, which waste can burden the manufacturing costs. For achieving the airtightness between the port and the storage apparatus, the airtight device is most preferably formed as a soft plastic component for its flexibility and adjustability that secure the gas against overflowing due to the misalliance between the port and the storage apparatus. However, while the conventional airtight device is provided as a separate component, additional fastening components are required to fix it, or alternatively, an additional site is needed to receive such airtight device and additional fastening components. Furthermore, the consumable character of the soft plastic material can not only increase the costs for preparing spare parts and replacing components, but also generate contamination such as chippings and particles. Besides, though the airtight device made of soft plastic materials can be adjusted due to its flexibility, once the complete surface contact between an air entrance of the storage apparatus and the port fails, gas overflowing can still happen and in turn cause increased costs. Moreover, the volatile material that the soft plastic material tends to release continuously is yet another contaminant source.

Seeing that, the inventor of the present invention provides a gas filling apparatus having a port formed with a cambered receiving part to improve the current technology.

SUMMARY OF THE INVENTION

For remedying the above-mentioned technical problem, the present invention provides a gas filling apparatus having a port formed with a cambered receiving part. The gas filling apparatus is connected with an air feed apparatus for filling a gas into a storage apparatus for storing a semiconductor element or a reticle. The gas filling apparatus comprises a base for bearing the storage apparatus and a port settled on the base. The port comprises a receiving part, which has a top connected with the air entrance of the storage apparatus. Contact portions of the top of the receiving part and the air entrance of the storage apparatus are formed as cambered surfaces so that these two contact portions contact mutually in a ring fashion which is formed by the cambered surfaces mated with each other. The port also comprises a hole passing through the port for allowing the gas to pass therethrough, and a joint part connected with a supply part.

Therefore, it is one objective of the present invention to provide a gas filling apparatus having a port formed with a cambered receiving part which achieves an effect of preventing gas overflowing while a need of an additional airtight device is eliminated.

It is another objective of the present invention to provide a gas filling apparatus having a port formed with a cambered receiving part which eliminates a need of additional fastening components for fixing a separate airtight device so as to save manufacturing costs.

It is another objective of the present invention to provide a gas filling apparatus having a port formed with a cambered receiving part which eliminates a need of an airtight device made of a soft plastic material so as to save costs for preparing spare parts and replacing components.

It is yet another objective of the present invention to provide a gas filling apparatus having a port formed with a cambered receiving part which eliminates a need of an airtight device made of a soft plastic material so as to eliminate chippings and volatile materials that possibly bring contamination to a storage apparatus.

It is still another objective of the present invention to provide a gas filling apparatus having a port formed with a cambered receiving part which contacts a cambered surface of the air entrance of the storage apparatus in a ring fashion which is formed by the cambered surfaces mated with each other, so as to accomplish a complete surface contact thereby preventing the gas from overflowing.

BRIEF DESCRIPTION OF THE DRAWINGS

The invention as well as a preferred mode of use, further objectives and advantages thereof, will best be understood by reference to the following detailed description of an illustrative embodiment when read in conjunction with the accompanying drawings, wherein.

DETAILED DESCRIPTION OF THE PREFERRED EMBODIMENT

While the present invention discloses a gas filling apparatus having a port formed with a cambered receiving part, it is to be stated first of all that the detailed manufacturing or processing procedures of the mentioned reticles, semiconductor elements, storage apparatuses and gas filling apparatuses relay on known technology and need not be discussed at length herein. Meantime, while the accompanying drawings are provided for purpose of illustration, it is to be understood that the components and structures therein need not to be made in scale.

Figure 1:
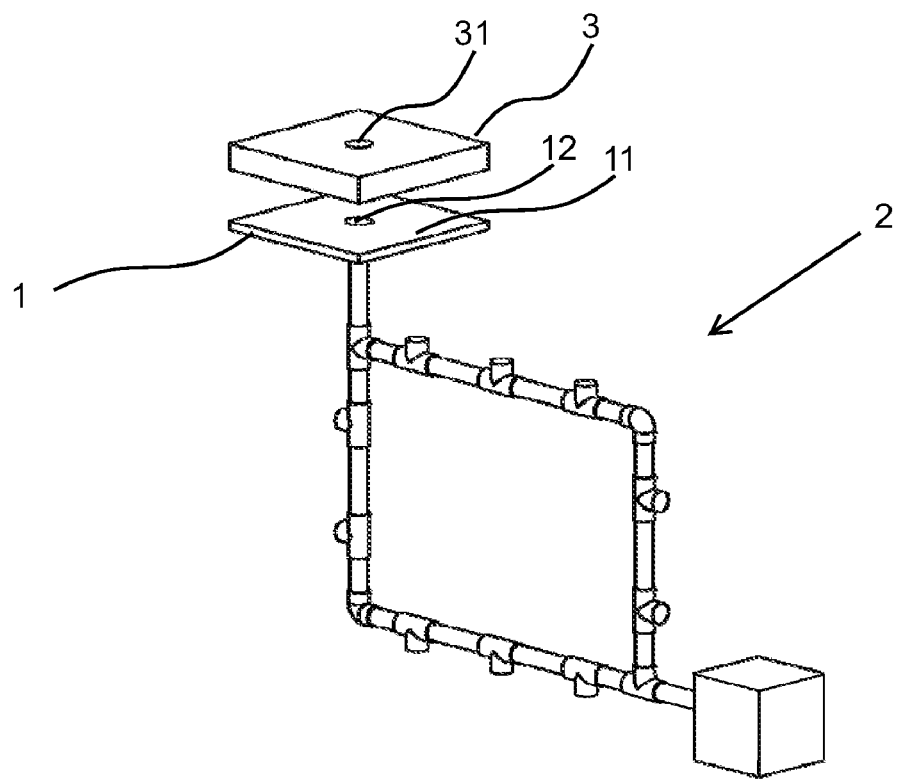
FIG. 1 is a schematic drawing of a gas filling apparatus of the present invention.

Please refer to FIG. 1 for a gas filling apparatus of the present invention. The gas filling apparatus 1 functions for filling a gas into a storage apparatus 3 for storing a semiconductor element or a reticle, wherein the storage apparatus 3 comprises at least one air entrance 31. The gas filling apparatus 1 is connected with an air feed apparatus 2 so that the air feed apparatus 2 provides the gas to the gas filling apparatus 1 and then the gas filling apparatus 1 fills the gas into the storage apparatus 3. The gas filling apparatus 1 comprises a base 11 and a port 12. The base 11 is provided for bearing the storage apparatus 3 and the port 12 is provided for transmitting the gas provided by the air feed apparatus 2 to the air entrance 31 of the storage apparatus 3 so that the gas can enter the storage apparatus 3.

Figure 2:
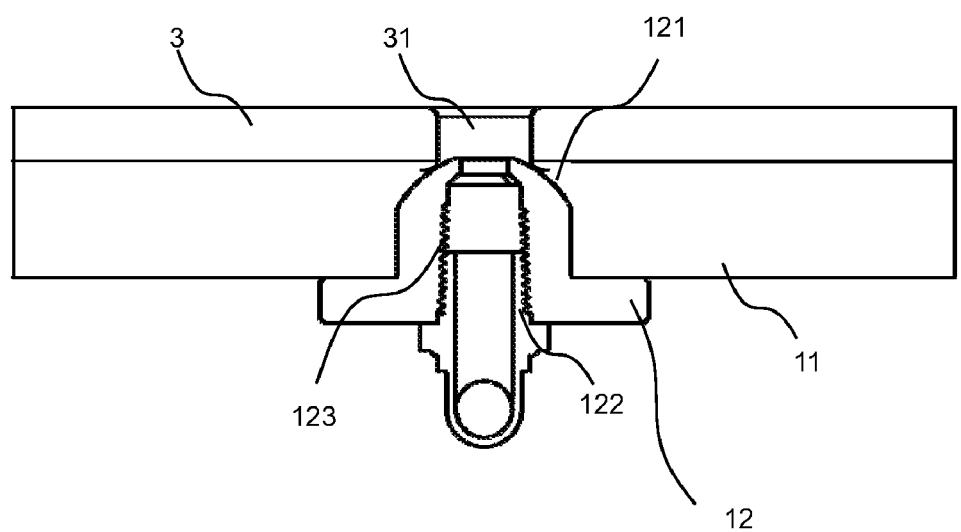
FIG. 2 is a schematic drawing of a port of the gas filling apparatus according to the present invention.

Now referring to FIG. 2, the port 12 is settled on the base 11 and positioned and corresponds with the air entrance 31 of the storage apparatus 3. The port 12 comprises a receiving part 121, a hole 122 and a joint part 123. Therein, the receiving part 121 is connected with the air entrance 31 of the storage apparatus 3 and the hole 122 is for allowing the gas to pass therethrough while the joint part 123 is connected with the air feed apparatus 2.

Figure 3:
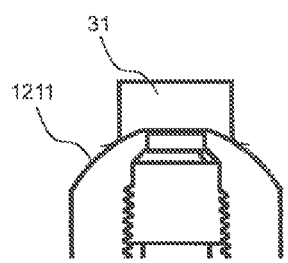
FIG. 3 is a schematic drawing showing a relationship between a top of the port and an air entrance of the storage apparatus according to the present invention.

According to FIG. 3, a top 1211 of the receiving part 121 of the port 12 and the air entrance 31 of the storage apparatus 3 are formed as cambered surfaces so as to contact mutually in a ring fashion which is formed by the cambered surfaces mated with each other. Thereupon, no matter how the air entrance 31 of the storage apparatus 3 is placed, as long as the same maintains in contact with the top 1211 of the receiving part 121, the aforementioned cambered surfaces contact in the ring fashion can be established to provide airtightness without any additional airtight device.

Figure 4A:
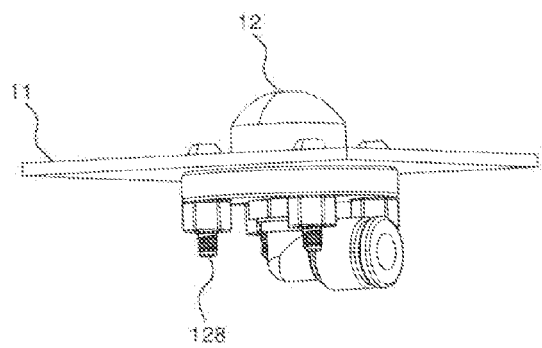
FIGS. 4A and 4B show a relationship between the port and a base according to the present invention.
Figure 4B:
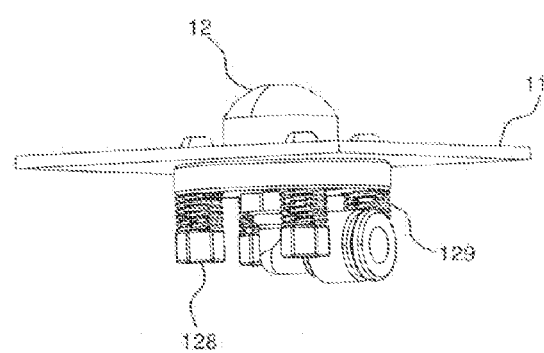

Besides, for better positioning the port 12, a fastener 128 may be provided to fix the port 12 on the base 11, as shown in FIG. 4A. For providing the receiving part 121 of the port 12 with a vertical movability against the base 11 so that the receiving part 121 can be always adapted to the storage apparatus 3 in order to maintain the airtightness, an elastic device 129 may be additionally provided on the fastener 128. The elastic device 129 may be a spring, or may be another component capable of providing elasticity, as shown in FIG. 4B.

Figure 5:
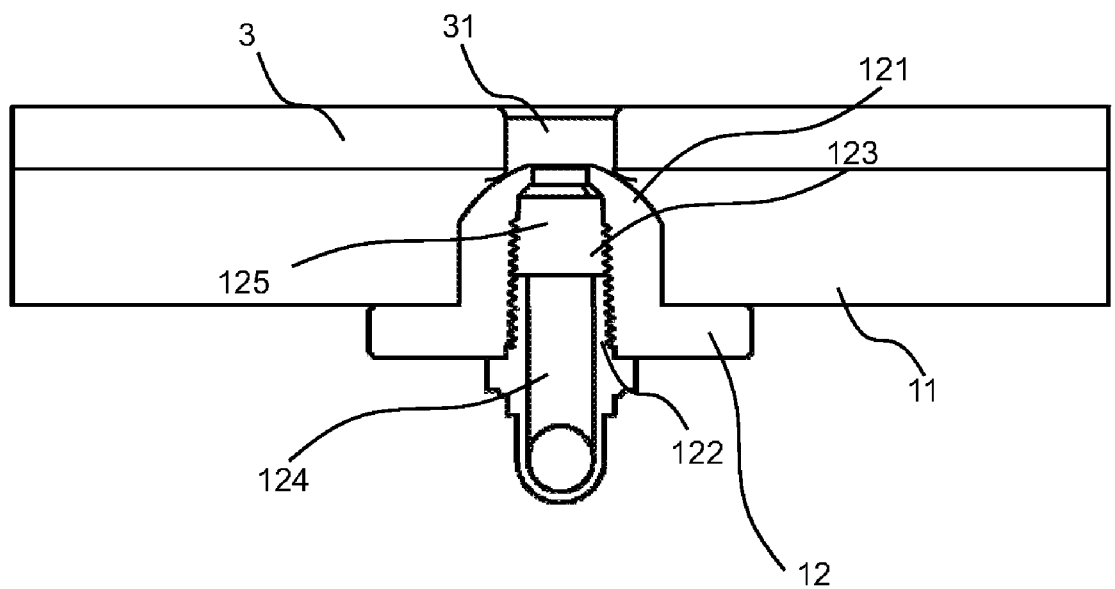
FIG. 5 is a schematic drawing showing a relationship between the port, an air pipe and a connector according to the present invention.

As can be seen FIG. 5, the gas filling apparatus 1 may further include an air pipe 124 connected between the joint part 123 of the port 12 and the air feed apparatus 2 so that the gas can pass through the air pipe 124 and the hole 122 of the port 12 to enter the storage apparatus 3. Moreover, the gas filling apparatus 1 may further include a connector 125 to connect the air pipe 124 and the joint part 123 of the port 12. It is to be noted that while this invention intends not to limit the connecting fashion, any means able to connect and even to closely combine the air pipe 124 and the joint part 123 may be used as the connector 125. According to one preferred embodiment of the present invention, the joint part 123 and the connector 125 may be formed with threads at portions thereof connecting each other so that the both components can be connected in a screwing manner.

Figure 6:
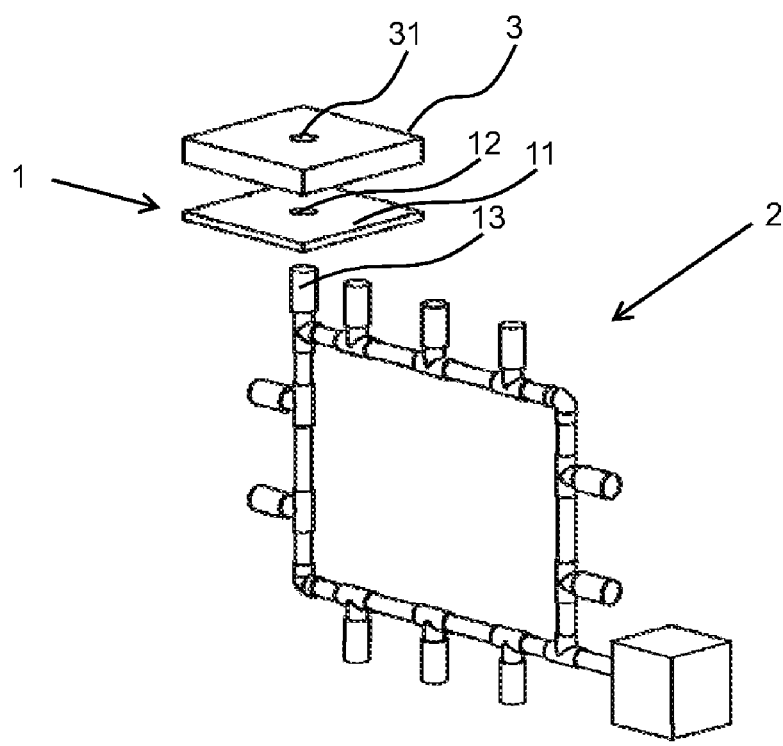
FIG. 6 is a schematic drawing showing a switch device assembled to the gas filling apparatus according to the present invention.

Furthermore, the disclosed gas filling apparatus 1 may be equipped with a switch device 13 for allowing or disallowing the gas to enter the storage apparatus 3, as shown in FIG. 6. The switch device 13 can be an electromagnetic valve, and especially can be a solenoid control valve. When the storage apparatus 3 is placed on the base 11 of the gas filling apparatus 1, and the air entrance 31 and the port 12 are properly aligned, the switch device 13 can be opened so as to allow the gas from the air feed apparatus 2 to enter the storage apparatus 3 through the port 12.

Figure 7:
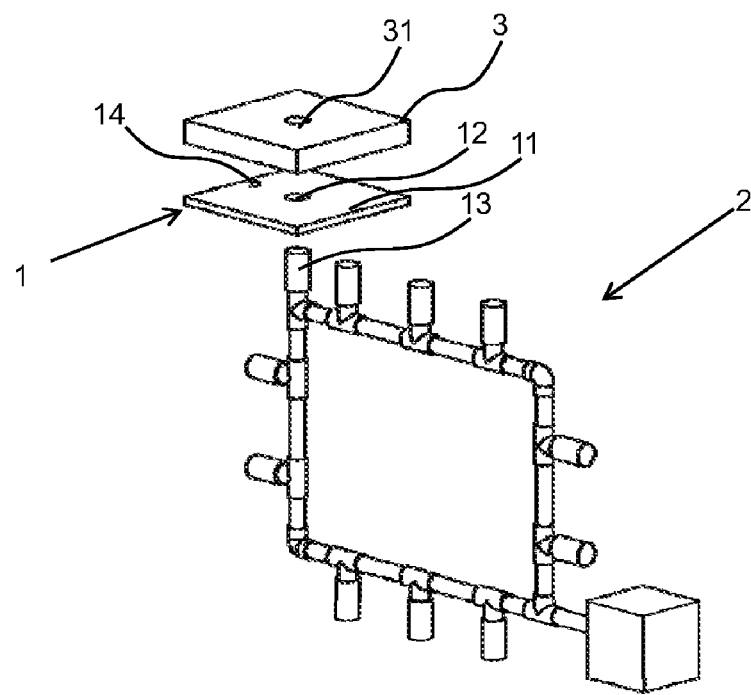
FIG. 7 is a schematic drawing showing a second sensor assembled to the gas filling apparatus according to the present invention.

For further automatizing the gas filling apparatus 1, a second sensor 14 may be additionally provided thereto, as shown in FIG. 7. The second sensor 14 may be deposited on the base 11 for sensing whether the air entrance 31 of the storage apparatus 3 is properly aligned with the port 12 of the gas filling apparatus 1. If so, the second sensor 14 can transmit a signal to the switch device 13 to open the switch device 13 so that the gas from the air feed apparatus 2 is allowed to enter the storage apparatus 3 through the port 12.

Figure 8:
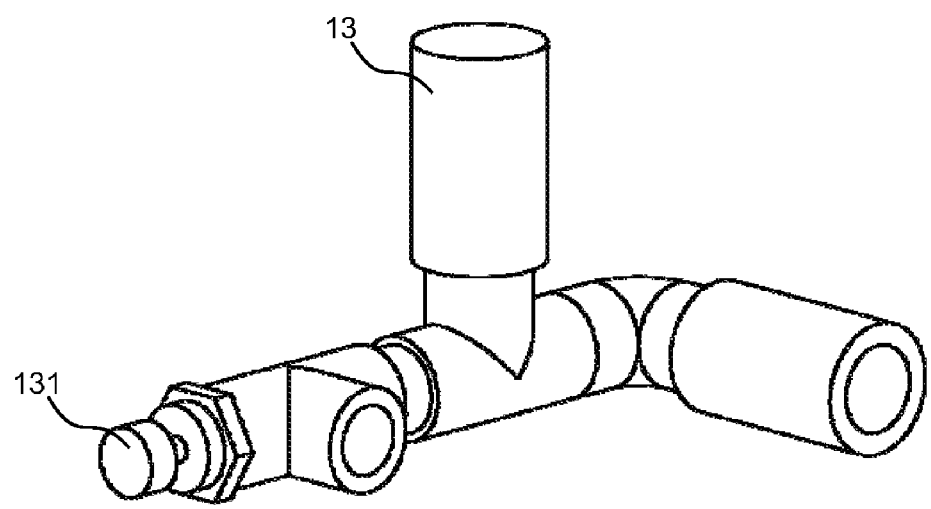
FIG. 8 is a schematic drawing of a flow regulator of the present invention.

Moreover, for preventing the gas entering the storage apparatus 3 from surging at the moment the switch device 13 is opened, a flow regulator 131 can be equipped, as shown in FIG. 8, for regulating the flow of the gas filled into the storage apparatus 3 when the switch device 13 is opened.

Figure 9:
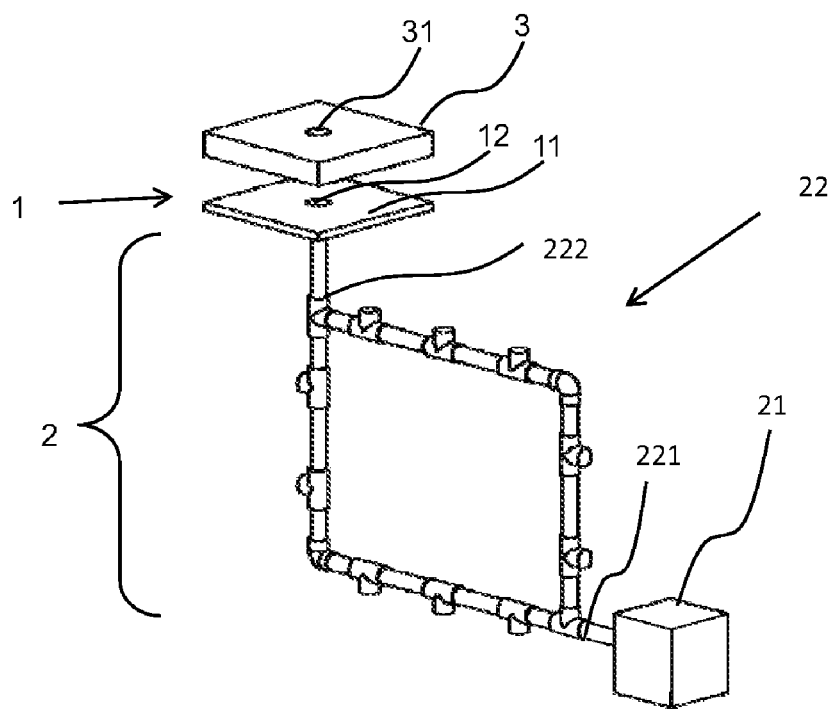
FIG. 9 is a schematic drawing of an air feed apparatus connected with the gas filling apparatus according to the present invention.

In addition, as shown in FIG. 9, the air feed apparatus 2 connected with the gas filling apparatus 1 comprises an air source 21 and an air route 22. The air route 22 is composed of an entrance part 221 and a supply part 222, wherein the entrance part 221 is connected with the air source 21 and the supply part 222 is provided for filling the gas into the storage apparatus 3.

Figure 10:
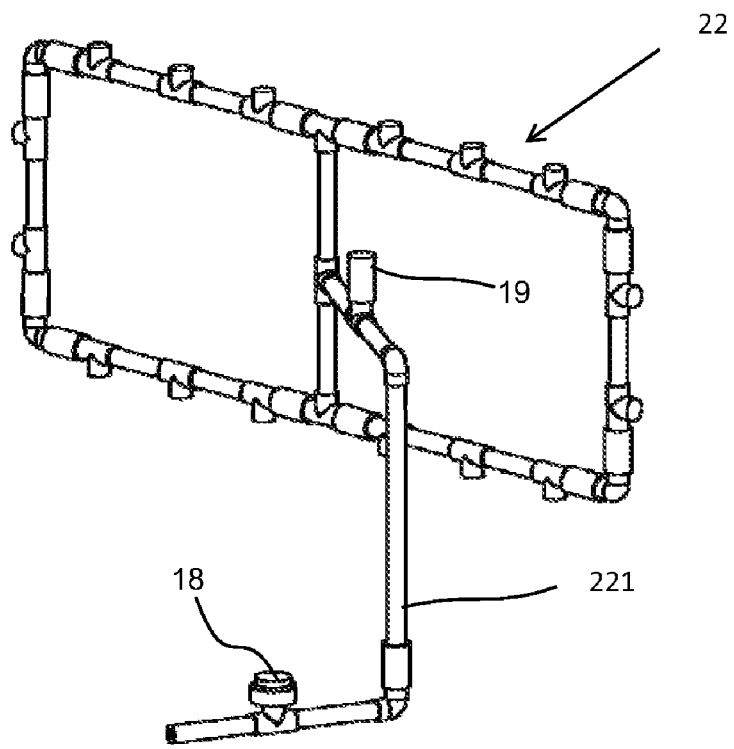
FIG. 10 is a schematic drawing showing a pressure stabilizer and a first sensor assembled to the gas filling apparatus according to the present invention.

According to FIG. 10, the present invention can further comprise a pressure stabilizer 18 settled in the air route 22 for regulating the pressure and the flow of the gas in the air route 22. Though the air route 22 normally maintains the gas therein at a stable gas flow, a larger amount of the gas flowing into the storage apparatuses 3 can result in an overall decrease in the gas pressure and gas flow in the air route 22. Thus, the pressure stabilizer 18 functions for adjusting the gas flow in the air route 22 so as to stabilize the overall gas pressure in the air route 22 and in turn ensure the gas filled into the storage apparatuses 3 with the stable gas pressure. Meanwhile, a first sensor 19 may be provided at the entrance part 221 for sensing the pressure and flow of the gas in the air route 22. The first sensor 19 is connected with the pressure stabilizer 18 so that first sensor 19 can transmit results related to the sensed gas pressure and gas flow to the pressure stabilizer 18. Consequently, the pressure stabilizer 18 can accordingly regulate the gas pressure and gas flow in the air route 22 so as to maintain the stability of the gas pressure and gas flow in the air route 22.

Figure 11:
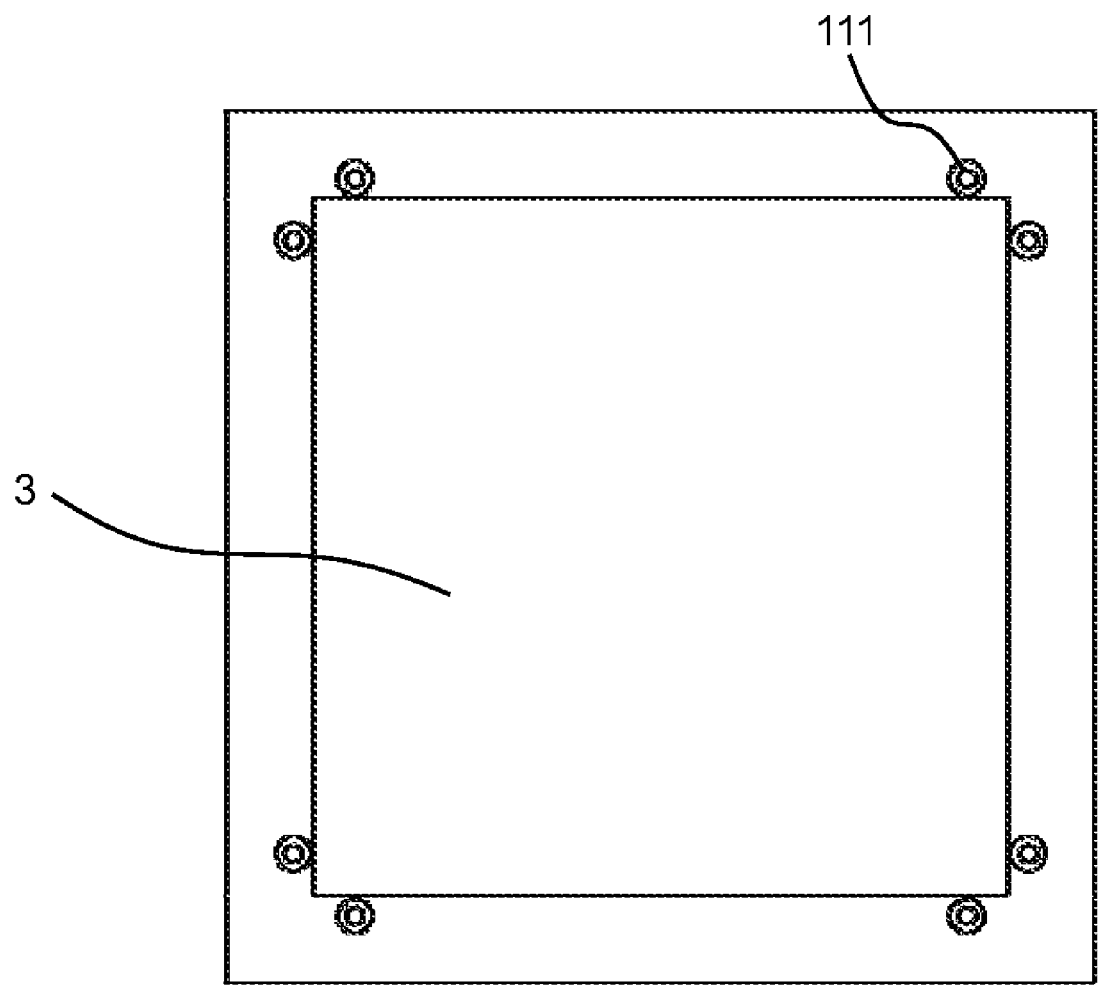
FIG. 11 is a schematic drawing showing guide device assembled to the gas filling apparatus according to the present invention.

Besides, for facilitating properly positioning the storage apparatus 3 for receiving the gas, at least one pair of guide device 111 may be provided on the base 11 so as to guide and aid the storage apparatus 3 to be placed on the base 11, as shown in FIG. 11.

Although the particular embodiments of the invention have been described in detail for purposes of illustration, it will be understood by one of ordinary skill in the art that numerous variations will be possible to the disclosed embodiments without going outside the scope of the invention as disclosed in the claims.

What is claimed is:

1. A gas filling apparatus, for filling a gas into a storage apparatus for storing a semiconductor element or a reticle, wherein the storage apparatus comprises at least one gas entrance while the gas filling apparatus is connected with a gas feed apparatus that has a gas source and a gas route, in which the gas route has an entrance part connected to the gas source and a supply part for filling the gas into at least one of said storage apparatus, and the gas filling apparatus comprises:
   at least one base, for bearing the storage apparatus; and
   at least one port, which is set on the base and corresponds with the gas entrance of the storage apparatus and comprises:
      a receiving part, having a top formed as a cambered surface connected with a cambered surface of the gas entrance of the storage apparatus in a ring fashion which is formed by the cambered surfaces mated with each other;
      a hole, passing through the port for allowing the gas to pass therethrough; and
      a joint part, connected with the supply part.

2. The gas filling apparatus of claim 1, further comprising at least one pair of guide device settled on the base for guiding and aiding the storage apparatus to be placed on the base.

3. The gas filling apparatus of claim 1, further comprising a gas pipe, connected between the joint part of the port and the supply part of the gas route.

4. The gas filling apparatus of claim 3, further comprising a connector, for connecting the joint part of the port and the gas pipe.

5. The gas filling apparatus of claim 1, further comprising a switch device, connected with the supply part of the gas route for allowing or disallowing the gas to enter the storage apparatus.

6. The gas filling apparatus of claim 5, wherein the switch device is a solenoid control valve.

7. The gas filling apparatus of claim 5, wherein when the air entrance of the storage apparatus is properly aligned with the port of the gas filling apparatus, the switch device can be opened to allow the gas to enter the storage apparatus.

8. The gas filling apparatus of claim 5, further comprising a second sensor settled on the base for sensing whether the air entrance of the storage apparatus is properly aligned with the port of the gas filling apparatus.

9. The gas filling apparatus of claim 8, wherein when the gas entrance of the storage apparatus is properly aligned with the port of the gas filling apparatus, the second sensor transmits a signal to the switch device to open the switch device so that the gas is allowed to enter the storage apparatus.

10. The gas filling apparatus of claim 5, wherein the switch device further comprises a flow regulator for regulating a flow of the gas filled into the storage apparatus.

11. The gas filling apparatus of claim 1, further comprising at least one fastener, for fixing the port on the base.

12. The gas filling apparatus of claim 11, wherein the fastener further comprises an elastic device for providing the receiving part of the port with a movability against the base.

13. The gas filling apparatus of claim 1, further comprising a pressure stabilizer settled at the entrance part of the gas route for regulating a pressure and a flow of the gas in the gas route.

14. The gas filling apparatus of claim 13, further comprising a first sensor settled at the entrance part of the air route for sensing the pressure and flow of the gas in the gas route.

15. The gas filling apparatus of claim 14, wherein the first sensor transmits a sensed result to the pressure stabilizer, so that the pressure stabilizer can regulate the pressure and flow of the gas in the gas route.

16. A gas filling apparatus, for filling a gas into a storage apparatus for storing a semiconductor element or a reticle, wherein the storage apparatus comprises at least one gas entrance while the gas filling apparatus is connected with a gas feed apparatus and the gas filling apparatus comprises:
   at least one base, for bearing the storage apparatus; and
   at least one port, which is set on the base and corresponds with the gas entrance of the storage apparatus and comprises:
      a receiving part, having a top formed as a cambered surface connected with a cambered surface of the air entrance of the storage apparatus in a ring fashion which is formed by the cambered surfaces mated with each other;
      a hole, passing through the port for allowing the gas to pass therethrough; and
      a joint part, connected with the gas feed apparatus.

* * * * *